(12) United States Patent
Behfar

(10) Patent No.: US 7,042,630 B2
(45) Date of Patent: May 9, 2006

(54) WAVELENGTH CONVERTER/INVERTER

(75) Inventor: Alex A. Behfar, Ithaca, NY (US)

(73) Assignee: Binoptics Corp., Ithaca, NY (US)

( * ) Notice: Subject to any disclaimer, the term of this patent is extended or adjusted under 35 U.S.C. 154(b) by 224 days.

(21) Appl. No.: 10/619,434

(22) Filed: Jul. 16, 2003

(65) Prior Publication Data

US 2005/0012982 A1 Jan. 20, 2005

(51) Int. Cl.
*G02F 1/35* (2006.01)
*G02F 1/365* (2006.01)

(52) U.S. Cl. ...................... 359/326; 359/332

(58) Field of Classification Search ........ 359/326–332; 372/22, 94
See application file for complete search history.

(56) References Cited

U.S. PATENT DOCUMENTS

| | | | |
|---|---|---|---|
| 4,807,953 A | * | 2/1989 | Smith et al. .................. 385/27 |
| 4,829,528 A | * | 5/1989 | Band et al. ..................... 372/3 |
| 4,851,368 A | | 7/1989 | Behfar-Rad et al. |
| 5,027,361 A | * | 6/1991 | Kozlovsky et al. .......... 372/22 |
| 5,031,190 A | | 7/1991 | Behfar-Rad |
| 5,132,983 A | | 7/1992 | Behfar-Rad |
| 5,349,601 A | | 9/1994 | Hohimer et al. |
| 2002/0063944 A1 | * | 5/2002 | Kim et al. .................. 359/326 |

FOREIGN PATENT DOCUMENTS

JP 8-186540 * 7/1996

* cited by examiner

*Primary Examiner*—John D. Lee
(74) *Attorney, Agent, or Firm*—Jones, Tullar&Cooper,P.C.

(57) ABSTRACT

A ring cavity laser has at least two facets and a mechanism is provided to produce unidirectional propagation and light emission at a first wavelength. A source of laser light at a second wavelength is injected into the cavity to reverse the direction of propagation and to produce emission at the second wavelength.

20 Claims, 5 Drawing Sheets

WAVELENGTH CONVERTER/INVERTER

BACKGROUND OF THE INVENTION

The present invention relates, in general, to a method and apparatus for providing a wavelength converter, and more particularly to a monolithic semiconductor ring laser assembly for converting a laser beam having a first wavelength to a corresponding laser beam having a second wavelength.

Advances in current monolithic semiconductor integration technology have permitted solid state lasers of complex geometry to be fabricated, including, for example, ring lasers having a variety of cavity configurations. Examples of such configurations are illustrated in U.S. Pat. No. 5,132,983, the disclosure of which is hereby incorporated herein by reference. These advances have expanded the potential applications for integrated semiconductor lasers, have added the attractiveness of improved manufacturability and reduced cost, and have opened the opportunity to explore new and novel features that can be incorporated within and outside the laser cavity.

Over the past few years, thanks mainly to the popularity of the Internet, the demand for increased bandwidth has experienced explosive growth. Some carrier companies and their suppliers have addressed this demand by installing wavelength division multiplexing (WDM) systems, which allow multiple wavelengths of light to be transmitted through a single strand of optical fiber. An important part of the enabling technology for this is the ability to convert optical signals having one wavelength of light to corresponding optical signals having another wavelength, and thus there is a growing need for effective, inexpensive wavelength converters.

SUMMARY OF THE INVENTION

The present invention is directed to the provision of monolithic semiconductor wavelength converters that are capable of providing either predetermined or variable wavelength shifts in an optical signal.

In one of its preferred forms, the invention includes a ring-type solid state laser having at least two facets. A first optical signal is supplied to the laser cavity input at a first facet, with this signal being in the form of a light beam at a wavelength $\lambda_2$ at a first angle to the first facet. This input signal results in laser propagation in a counter-clockwise (ccw) mode within the ring laser cavity to produce an output R of laser light at the wavelength $\lambda_2$ at the second, or output facet. In accordance with the invention, a second optical input signal A of laser light having a wavelength $\lambda_1$ is directed into the laser cavity at a second angle to the first facet. If the second optical input is stronger than the first, and the first and second angles are symmetric about the perpendicular to the first facet, injection locking and light propagation in the clockwise (cw) mode is produced, substantially eliminating the output R. In this manner, the output signal R at wavelength $\lambda_2$ is switched on and off by the absence or presence, respectively, of an input signal at wavelength $\lambda_1$, thereby converting the input signal at $\lambda_1$ to an inverted output signal at $\lambda_2$.

One use of the foregoing converter/inverter is in wavelength divisional multiplexing, where multiple input optical signals of a single wavelength, for example $\lambda_1$, are to be transmitted through a single optical fiber. In such a case, each of the input signals may be supplied to a different, corresponding converter, each of which normally operates at a different wavelength $\lambda_2$, $\lambda_3$, etc. Supplying a first input signal at wavelength $\lambda_1$ to the first converter will change that first signal to a first inverted signal at $\lambda_2$. Similarly, supplying a second input signal also at $\lambda_1$, to a second converter will change that second signal to a second inverted signal at $\lambda_3$, and so on for additional input signals. The inverted output signals $\lambda_2$, $\lambda_3$, etc. may then be transmitted through a single optical fiber (for example) and recovered at the opposite end of the transmission line and, if desired, converted back to the original wavelength $\lambda_1$ through corresponding converter/inverters.

In accordance with the invention, the ring lasers may utilize straight waveguide sections and facets, but preferably will incorporate curved waveguide sections to eliminate unneeded facets. Although a variety of ring lasers can be used to form a wavelength converter, the preferred ring lasers are the solid state curved waveguide lasers disclosed in copending U.S. patent application Ser. No. 09/918,544 of Alex Behfar, filed Aug. 1, 2001 and entitled "Curved Waveguide Ring Laser", the disclosure of which is hereby incorporated herein by reference. As is known, a ring laser can operate in clockwise (cw) or counter-clockwise (ccw) modes, and a number of ways are available in the art to force these lasers to propagate in one direction or the other, as described in copending U.S. patent application Ser. No. 09/918,548 of Alex Behfar, filed Aug. 1, 2001 and entitled "Unidirectional Curved Ring Lasers"; the disclosure of which is hereby incorporated herein by reference.

In a second embodiment of the invention, a wavelength tunable source provides the first optical input to the a ring laser wavelength converter described above to permit different wavelength shifts.

BRIEF DESCRIPTION OF DRAWINGS

The foregoing, and additional objects, features, and advantages of the present invention will be apparent to those of skill in the art from the following detailed description of preferred embodiments thereof, taken in conjunction with the accompanying drawings, in which.

DESCRIPTION OF PREFERRED EMBODIMENT

Figure 1:
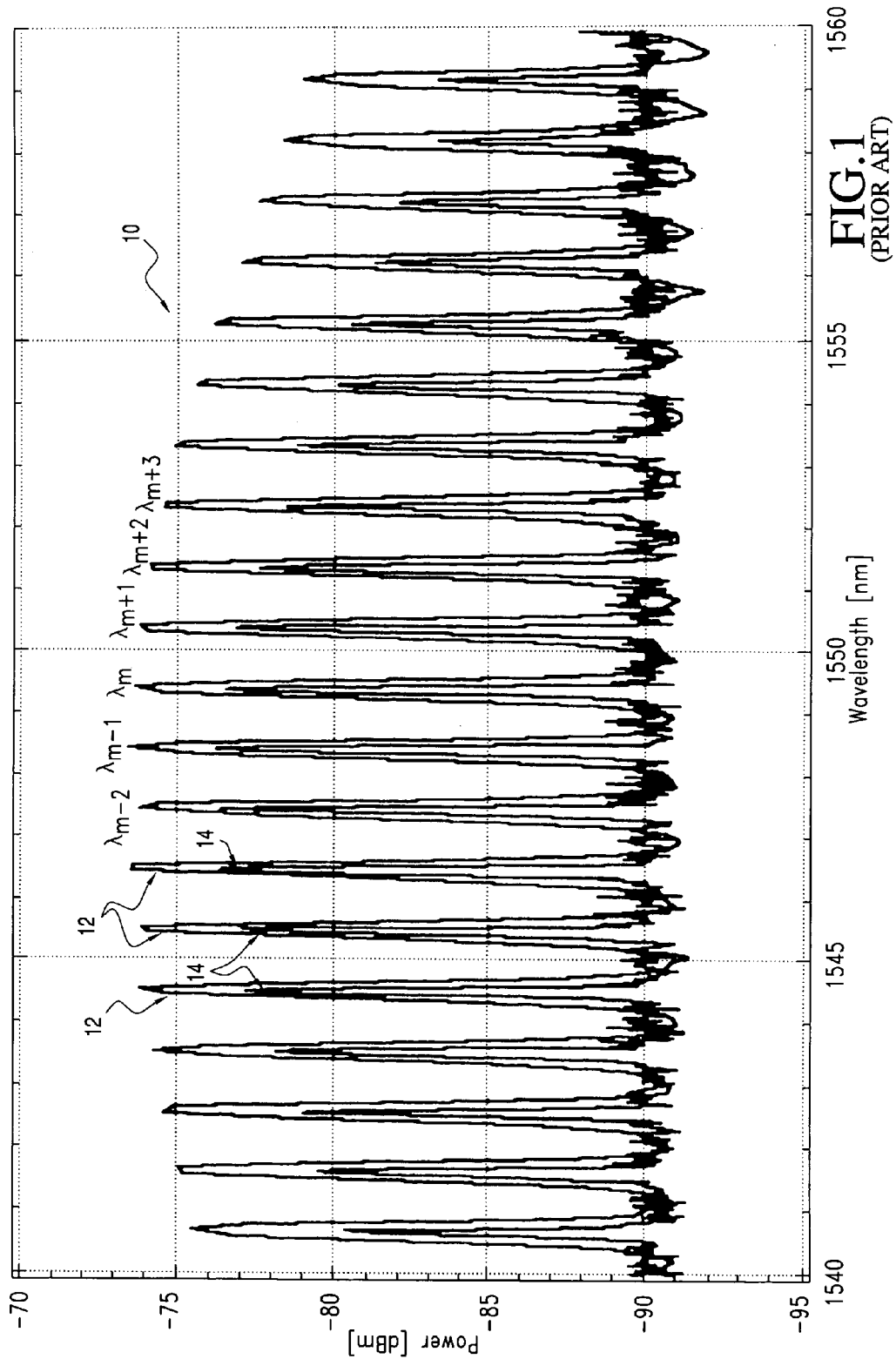
FIG. 1 is a graphical illustration of power vs wavelength for the spectra of the optical output of a free-running ring laser, including the longitudinal modes visible at a bias current above its threshold current for lasing.

Turning now to a more detailed description of the present invention, as illustrated graphically in FIG. 1 by the spectra 10 of a typical free-running solid state laser, a ring laser has certain allowed longitudinal modes, illustrated by spectral peaks 12 and 14 superimposed spectral peaks for both clockwise and counterclockwise modes, with peaks 12 corresponding to clockwise modes and peaks 14 corresponding to counterclockwise modes. As illustrated, the ccw and cw peaks occur at substantially the same wavelengths. For a free running bi-directional ring laser the optical output corresponding to the cw and ccw modes can be equal, but it has been experimentally observed that in many cases the outputs tend to be unequal. Typically, such a laser will oscillate in one or more of these allowed longitudinal modes. FIG. 1 is a graph of actual longitudinal modes observed for a ring laser at a bias current above the threshold current for the laser. A number of modes are visible at spectral peak positions indicated by . . . , $\lambda_{m-2}$, $\lambda_{m-1}$, $\lambda_m$, $\lambda_{m+1}$, $\lambda_{m+2}$, $\lambda_{m+3}$, . . . , and these peaks correspond to the allowed modes of the laser. The absolute position of these modes, i.e., the exact wavelength of each peak, can be controlled and adjusted in a variety of ways, including thermal and electrical, as is known in the art.

Figure 2A:
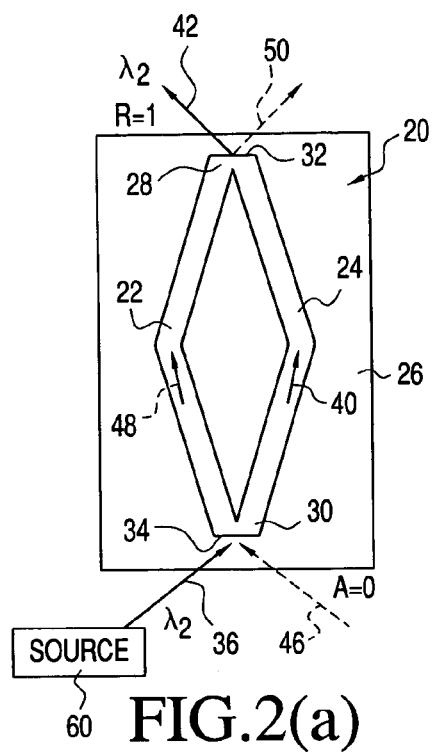
FIGS. 2(a) and 2(b) are diagrammatic top plan views of two states of a first embodiment of a wavelength converting ring laser in accordance with the present invention.
Figure 2B:
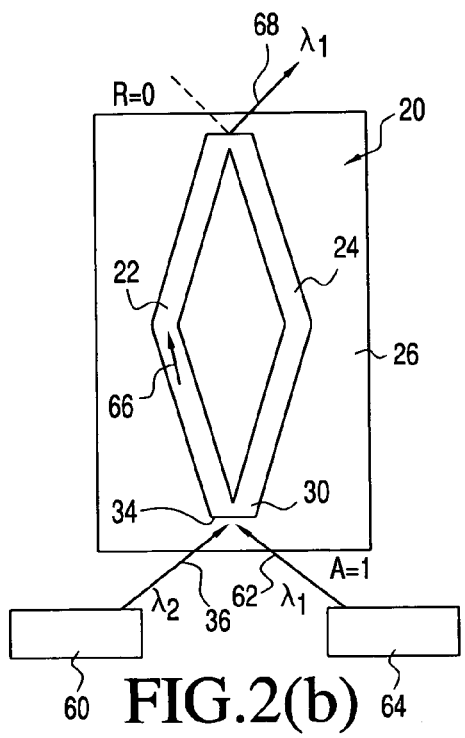

FIGS. 2(a) and 2(b) are directed to a first embodiment of the present invention, wherein a wavelength converting ring laser 20 includes first and second curved semiconductor waveguides 22 and 24 integrally fabricated on a substrate 26 to form a laser cavity. The fabrication of such semiconductor lasers is known in the art, and is described, for example, in U.S. Pat. No. 4,851,368. As illustrated in FIGS. 2(a) and 2(b), the waveguides 22 and 24 of laser 20 are spaced apart and preferably are curved inwardly to meet at upper and lower junctures 28 and 30. Facets 32 and 34 are formed at upper and lower junctures 28 and 30, respectively, in known manner, with the curvature of the arms being selected to allow an external light beam, such as beam 36 directed at a critical angle toward facet 34 and having a wavelength $\lambda_2$ corresponding to one of the longitudinal modes of the laser cavity 20 to enter and to propagate around the interior of the ring laser when the laser is properly biased, in known manner. The light will propagate in a clockwise or in a counterclockwise direction within the laser cavity, depending on the angle of the impinging beam 36; in the illustrated example, beam 36 produces counterclockwise propagation of light in cavity 20, as indicated by arrow 40.

Light beam 40 propagating in the laser cavity 20 is primarily reflected internally from the inner surfaces of facets 32 and 34, with a selected portion of the light striking the inner surface of outlet facet 32 in FIG. 2(a), at an angle to produce an outlet beam 42 at wavelength $\lambda_2$, corresponding to input beam 36.

It will be understood that if the angle of the input beam 36 with respect to facet 34 were shifted, so that the input to facet 34 is in the direction of beam 46 (shown in phantom in FIG. 2(a)), the resulting propagation of light in cavity 20 would be in the clockwise direction, illustrated by phantom beam 48, and the output from facet 32 would be in the direction illustrated by phantom beam 50.

The converter/inverter of the present invention is illustrated in FIGS. 2(a) and 2(b) as incorporating the ring laser 20 having a first optical input signal, or beam 36. In the illustrated embodiment, the signal may be a laser beam of substantially constant amplitude generated by a suitable source 60 such as a laser at a wavelength $\lambda_2$ matching a longitudinal mode of the ring laser. The beam 36 impinges on facet 34 and enters the cavity of laser 20, where it is propagated in a counterclockwise direction, under suitable bias, to emit output beam 42, also at the wavelength $\lambda_2$, which may be referred to as output "R". In the "normal" state of the laser, the output R is present, so R=1.

A second input location is available for facet 34 of laser 20, as discussed above with respect to the phantom beam 46. This second input, which may be referred to as input "A", is symmetrical with input beam 36 about a line perpendicular to the surface of facet 34, but in the device illustrated in FIG. 2(a) there is no input at this location, so A=0.

As illustrated in FIG. 2(b) an incoming optical signal indicated at beam 62 from a source 64 may be supplied to impinge on facet 34 of ring laser 20 at input A of the laser simultaneously with input beam 36. If input beam 62 is stronger than beam 36, i.e., has a higher intensity, and if beam 62 is at a wavelength $\lambda_1$ that is different than the wavelength $\lambda_2$ ($\lambda_1 \neq \lambda_2$) but that corresponds to any of the longitudinal modes of the ring laser 20, then the input A=1, the presence of this beam 62 will cause the ring laser to operate in a counterclockwise direction, indicated by arrow 66. As a result, the output signal at output facet 32 will switch from beam 42 to a second output beam 68, which will be at wavelength $\lambda_1$, and the output at R will be cut off; i.e., R=0.

The input at A, represented by beam 62, may be a photonic data stream of 1's and 0's at wavelength $\lambda_1$ which modulates the output of ring laser 20. Thus, the absence of a data bit (A=0) causes the laser 20 to produce a corresponding data bit output signal R=1 at wavelength $\lambda_2$. The presence of a data bit (A=1) at wavelength $\lambda_1$ produces a corresponding data bit output signal R=0.

The illustrated ring laser wavelength converter 20 thus operates in such a way that when input A=0, the output R=1, with the output having a wavelength $\lambda_2$. When input A is present, i.e., when A=1, then output R=0. This is summarized in Table 1:

TABLE 1

| Value of A | Wavelength of A | Value of R | Wavelength of R |
|---|---|---|---|
| 0 | — | 1 | $\lambda_2$ |
| 1 | $\lambda_1$ | 0 | — |

In addition to performing a wavelength conversion function from $\lambda_1$ to $\lambda_2$, the ring laser wavelength converter performs an inverter function on the incoming photonic bit stream of input A, so that the corresponding output photonic bit stream R is inverted from that of A.

Figure 3A:
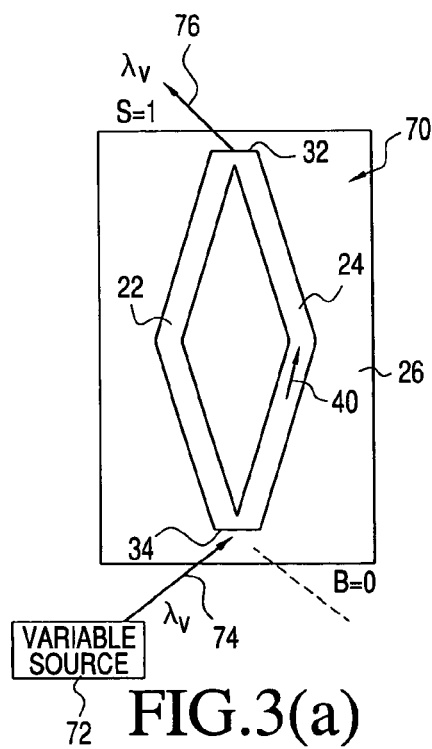
FIGS. 3(a) and 3(b) are diagrammatic top plan views of two states of a second embodiment of a wavelength converting ring laser, capable of converting an input optical signal to multiple wavelengths in accordance with the present invention.
Figure 3B:
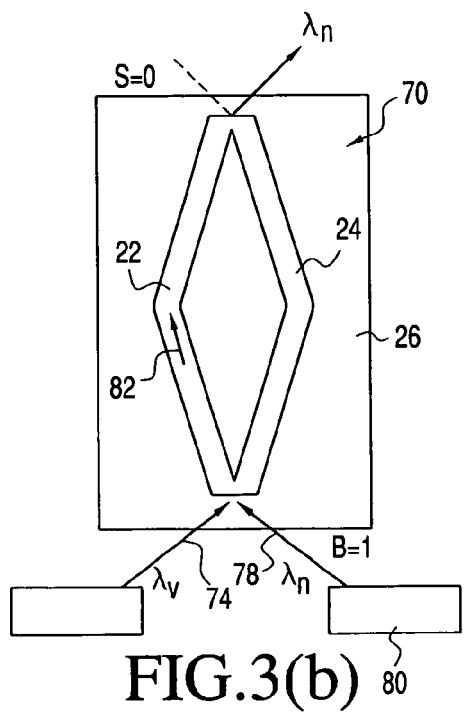

FIGS. 3(a) and 3(b) illustrate a modified form of the embodiment described above, providing a wavelength converting ring laser 70, capable of conversion to multiple wavelengths. Elements common to the embodiment of FIGS. 2(a) and 2(b) are commonly numbered. These figures schematically illustrate the operation of a ring laser wavelength converter 70 that is capable of converting the wavelength of an input signal at input B to multiple different wavelengths, $\lambda_\nu$ and of inverting the input signal. FIG. 3(a) illustrates the operation of ring laser wavelength converter 70 with the input B in an off state, or B=0. The normal input to the ring laser 70 is a signal from a variable wavelength source 72, which may be a tunable laser producing a variable wavelength optical signal $\lambda_\nu$, represented by beam 74 and variable to select a beam wavelength which corresponds to any of the allowed longitudinal modes of the ring laser. This input at a selected wavelength $\lambda_\nu$ causes the ring laser to operate in the ccw and results in a "normal" output signal S=1 represented by beam 76 at wavelength $\lambda_\nu$.

FIG. 3(b) illustrates the situation where an incoming optical input B of wavelength $\lambda_n$, represented by beam 78, is supplied by a source 80 such as photonic data stream of pulses. If the signals of input B are is stronger in light intensity than the input 74 to the ring laser at wavelength $\lambda_\nu$, the ring laser 70 will operate in the cw direction indicated by arrow 82, so that when B=1, then S=0. The wavelength $\lambda_n$ corresponds to any of the longitudinal modes of the ring laser, and wavelength conversion will occur when $\lambda_n \neq \lambda_v$, allowing the signal input B to modulate the corresponding output S.

Following the same logic as for the ring laser of FIGS. 2(a) and 2(b), the behavior of the laser 70 can be summarized in Table 2:

TABLE 2

| Value of B | Wavelength of B | Value of S | Wavelength of S |
|---|---|---|---|
| 0 | — | 1 | $\lambda_v$ |
| 1 | $\lambda_n$ | 0 | — |

In addition to performing a wavelength conversion function from $\lambda_n$ to $\lambda_v$, the ring laser wavelength converter 70 performs an inverter function on the incoming photonic bit stream of input B, so that the output photonic bit stream S is inverted from that of B.

Figure 4:
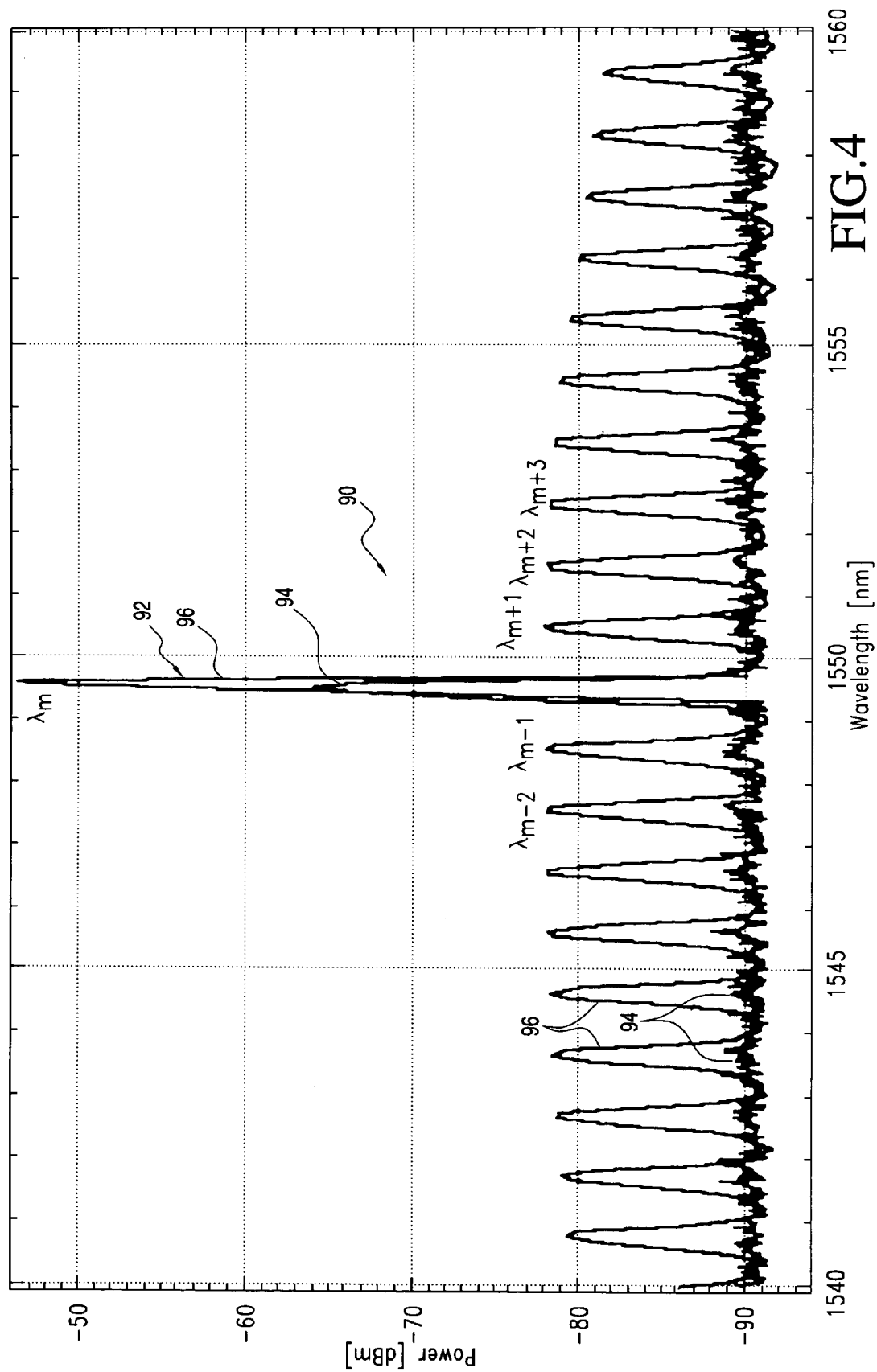
FIG. 4 is a graphical illustration of the power vs wavelength of the spectrum of the ring laser of FIG. 2 with the introduction of a weak signal input $\lambda_1$.

FIG. 4 illustrates the spectra 90 and the longitudinal modes of a ring laser corresponding to the state depicted in FIG. 3(a) where $\lambda_v = \lambda_m$, B=0 and S=1. The peak 92 corresponds to the longitudinal mode for wavelength $\lambda_m$, and is caused by injection locking of the input wave. It is noted that the graph of FIG. 4 includes spectra of both the cw mode (indicated at 94) and the ccw mode (indicated at 96), both of which are present in the ring laser. Because of the injection locking caused by input beam 74, the counterclockwise mode (arrow 40 in FIG. 3(a)) is dominant, and the clockwise mode is weak. When the stronger input signal at wavelength $\lambda_n$ is injected (B=1), injection locking within the ring laser will cause the clockwise propagation mode to dominate, and under this condition the output S=0.

Although the ring lasers illustrated in FIGS. 2(a), 2(b), 3(a) and 3(b) incorporate curved waveguides, it will be understood that straight waveguide segments having faceted junctures can be used. Such waveguides are used in the ring lasers illustrated in FIGS. 5(a) and 5(b), which lasers in turn may instead incorporate curved waveguides.

The wavelength converters described above are able to efficiently convert one wavelength to another by an amount that is determined by the gain profile of the particular laser. A larger wavelength shift can be achieved by cascading two or more converters, in the manner illustrated at 98 in FIGS. 5(a) and 5(b), provided that the gain profile of the succeeding laser overlaps that of the prior laser, but extends beyond the gain curve of the prior laser.

Figure 5A:
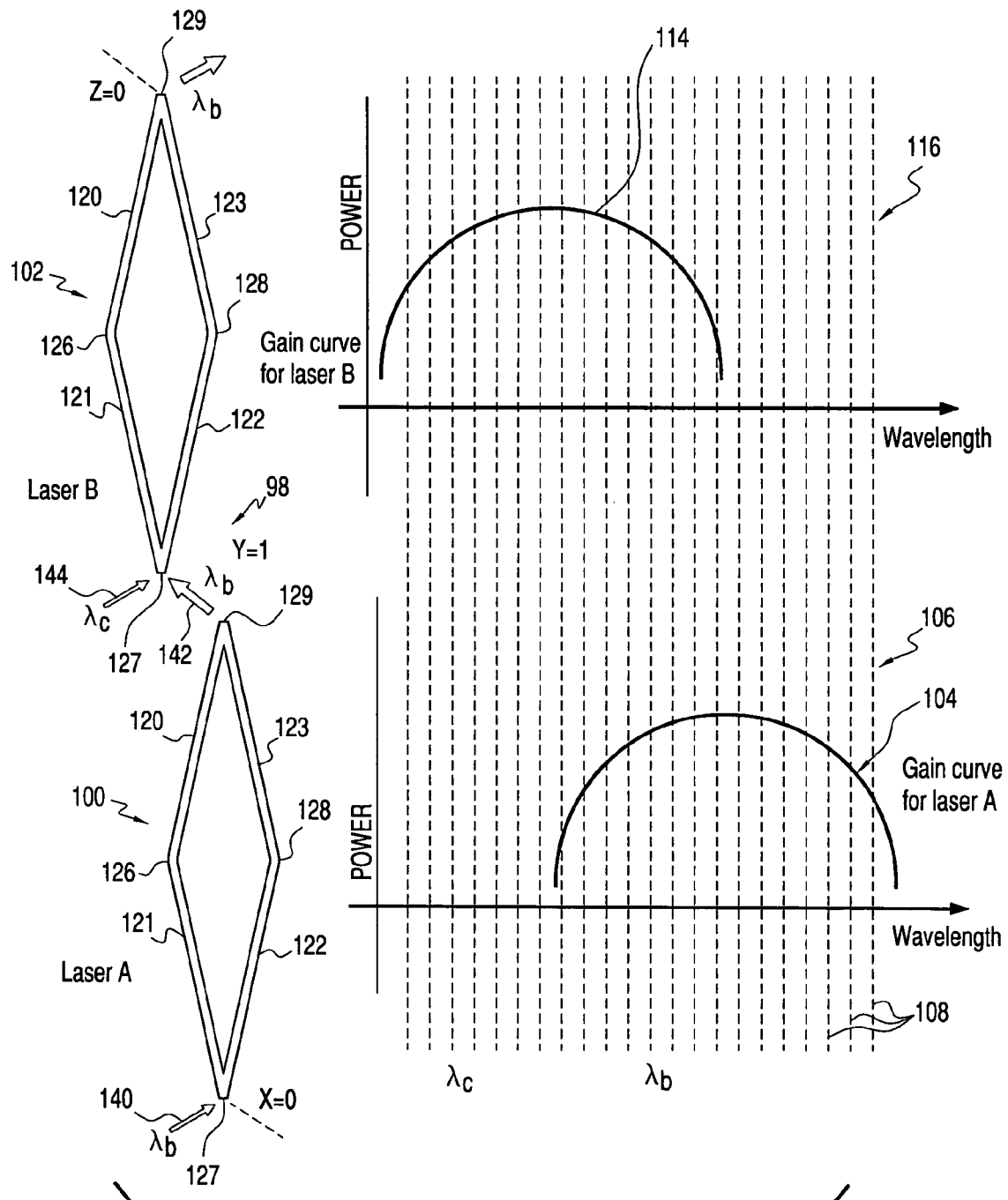
FIGS. 5(a) and 5(b) are diagrammatic illustrations of two states of a two-stage ring laser wavelength converter, and the respective gain curves for each ring laser.
Figure 5B:
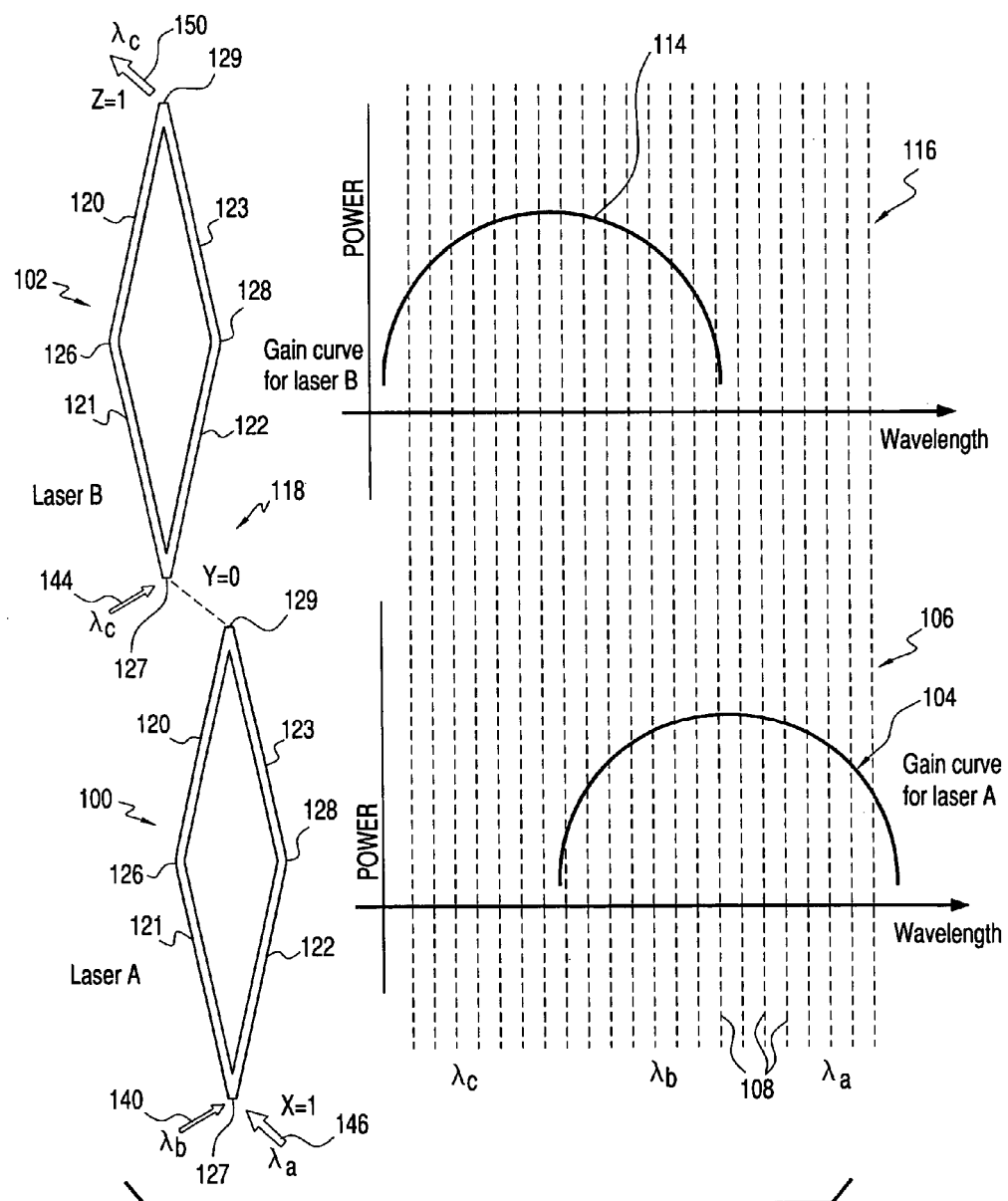

As diagrammatically illustrated in FIG. 5(a) a first ring laser 100 (labeled Laser A) is cascaded with a second ring laser 102 (labeled Laser B) so that the normal optical output from the first, or prior, laser 100 is the optical input injected into the second, or succeeding, laser 102. The gain curve for laser 100 is illustrated at 104 on a graph 106 representing the spectrum of the laser. For simplicity, the positions of the longitudinal modes of the laser are illustrated by dashed lines 108, with the gain curve 104 illustrating the power of the output from the laser when it operates at wavelengths corresponding to the various modes 108. Similarly, the gain curve for laser 102 is illustrated at 114 on graph 116 representing the spectrum of laser 102. For simplicity, the positions of the longitudinal modes are identical to those of laser 100, and thus are also indicated by dashed lines 108. FIG. 5(b) is similar to FIG. 5(a) but the two figures differ in that FIG. 5(a) illustrates the normal condition in the absence of a modulating signal to be converted, while FIG. 5(b) illustrates the modulated condition, where an input modulating signal to be converted is present.

Lasers 100 and 102 both incorporate waveguide legs 120–123 which are joined at facets 126–129 to form a ring cavity, in known manner.

FIG. 5(a) and (b) schematically show the operation of the two-ring laser wavelength converter 98 as converting a wavelength $\lambda_a$ at an input X (similar to input A of FIG. 2(b)) to a corresponding wavelength $\lambda_c$ at output Z. As illustrated in FIG. 5(a), the ring laser wavelength converter 98 initially has a modulating, or signal input X=0 to ring laser A, and also has a "normal" input 140 to ring laser A that is at wavelength $\lambda_b$, where $\lambda_b$ corresponds to any of the allowed longitudinal modes of both the ring lasers A and B. This input at wavelength $\lambda_b$ causes the ring laser A to operate normally in the ccw and results in a normal output Y=1 at wavelength $\lambda_b$, represented by beam 142. Y serves as the modulating, or signal, input to ring laser B and is stronger in intensity than a second "normal" input 144 to ring laser B at wavelength $\lambda_c$. Wavelength $\lambda_c$ corresponds to a longitudinal mode of ring laser B, and produces ccw mode propagation in ring laser B in the absence of signal Y, in which case its output is Z=1. In the presence of Y, the ring laser B will operate in the cw mode, resulting in output Z=0.

FIG. 5(b) shows the situation for X=1 where an incoming optical modulating signal of wavelength $\lambda_a$, represented by beam 146, is stronger in light intensity than the input 140 at wavelength $\lambda_b$. This causes the ring laser A to operate in the cw direction so that Y=0, because of the modelocking effect of input X=1. Since Y=0, the only input to ring laser B is the normal input at wavelength $\lambda_c$, so ring laser B operates in the ccw mode and results in Z=1 at wavelength $\lambda_c$, indicated at output beam 150. Accordingly, the two-stage converter 98 receives input signals such as photonic pulsed signals at input 146 at a first wavelength $\lambda_a$, and emits corresponding pulses at a second wavelength $\lambda_c$, at output 150, thus converting the data signal wavelength without inverting the signal.

Ring lasers of different cavity lengths can be used for ring lasers A and B, the only requirement being that the longitudinal modes of the two lasers intersect at $\lambda_b$. Additional ring lasers can be cascaded to laser B, to produce additional wavelength conversion or to invert the modulating signal.

Although the present invention has been described and illustrated in terms of preferred embodiments, it will be apparent to those of skill in the art that numerous variations and modifications may be made without departing from the true spirit and scope of the invention, as set out in the following claims.

What is claimed is:

1. A method of converting an optical signal of a first wavelength to a corresponding optical signal of a second wavelength, comprising:
   providing at least one monolithic ring laser having an input facet and an output facet;
   activating said at least one ring laser to produce an output optical signal having said second wavelength at said output facet; and
   modulating said output optical signal by supplying to said inlet facet an optical signal having said first wavelength.

2. The method of claim 1, wherein activating said at least one ring laser includes injecting an optical signal having said second wavelength at said inlet facet.

3. The method of claim 2, wherein modulating said output optical signal includes injecting into said at least one ring laser an optical signal having said first wavelength and having an intensity greater than the intensity of said signal at said second wavelength.

4. The method of claim 3, wherein modulating said output signal includes switching off said output signal in the presence of said modulating signal, and switching on said output signal in the absence of said modulating signal to invert said modulating signal and to convert it to a different wavelength.

5. The method of claim 3, further including providing first and second ring lasers in cascade, wherein modulating said output signal includes switching off said output signal in the absence of said modulating signal and switching on said output signal in the presence of said input modulating signal to convert said input signal to a different wavelength.

6. The method of claim 3, wherein modulating said output optical signal includes injecting an optical data pulse stream into said at least one ring laser.

7. The method of claim 1, wherein activating said at least one ring laser includes injecting a variable optical signal having a selectable wavelength.

8. The method of claim 1, wherein actuating said at least one ring laser comprises causing light to propagate in said laser in a first direction, and wherein modulating said output optical signal comprises supplying said first wavelength optical signal to said inlet facet at an intensity sufficient to reverse the direction of propagation of light in said laser to thereby switch off said second wavelength output optical signal.

9. A wavelength converter, comprising:
 a monolithic ring laser having at least an input facet and an output facet;
 a first inlet modulating beam for injecting an optical signal having a first wavelength for propagation in said ring laser in a first direction; and
 a second inlet beam for injecting an activating optical signal having a second wavelength for propagation in said ring laser in a second direction to normally produce an outlet optical signal having said second wavelength, wherein said first inlet modulating beam has an intensity greater than said second inlet beam, whereby the presence and absence of said modulating beam modulates said outlet optical signal.

10. The converter of claim 9, wherein the presence of said modulating beam reverses the direction of light propagating in said ring laser to modulate said outlet optical signal.

11. The converter of claim 9, wherein said modulating beam is a first bit stream, and wherein said outlet optical signal is a corresponding bit stream inverted from said first bit stream.

12. The converter of claim 9, wherein said modulating beam has a variable wavelength selectable to correspond with any allowed longitudinal modes of said ring laser.

13. The converter of claim 9, further including a second monolithic ring laser in cascade with said first-named ring laser output facet.

14. The converter of claim 13, wherein said cascaded monolithic ring lasers have different cavity lengths.

15. A wavelength converter, comprising:
 a monolithic ring laser having at least an input facet and an output facet, said laser, when activated, producing an output beam having a wavelength $\lambda_2$, said output beam being switched off upon receipt of an input beam of wavelength $\lambda_1$, at said inlet facet, the converter further including a first source for supplying a first optical input signal at wavelength $\lambda_2$ to an input facet to produce said output beam of wavelength $\lambda_2$ and a second source for supplying a second optical input signal at wavelength $\lambda_1$ to an input facet to modulate said output beam.

16. The converter of claim 15, wherein the wavelength $\lambda_1$ of said second optical input signal corresponds to any longitudinal mode of said ring laser, and wherein said second optical input signal has an intensity greater than the intensity of said first optical signal, whereby the receipt of said second optical input signal switches off said output beam.

17. The converter of claim 16, wherein said second optical input signal is a photonic data stream at wavelength $\lambda_2$ which produces a corresponding inverted output photonic data stream of wavelength $\lambda_1$.

18. The converter of claim 15, wherein said first and second optical input signals impinge symmetrically on a single input facet to produce propagation in opposite directions within said ring laser.

19. A wavelength converter, comprising:
 a monolithic ring laser having at least an input facet and an output facet, said laser, when activated, producing an output beam having a wavelength $\lambda_2$, said output beam being switched off upon receipt of an input beam of wavelength $\lambda_1$ at said inlet facet, said laser, when activated, propagating light in a first of two directions in said ring to produce said output beam of wavelength $\lambda_2$, said input beam of wavelength $\lambda_1$ causing light in said ring to propagate in a second of said two directions to switch off said output beam.

20. The converter of claim 19, wherein said input beam at wavelength $\lambda_1$ is modulated to produce a corresponding inverted output beam of wavelength $\lambda_2$.

* * * * *